(12) United States Patent
Choi et al.

(10) Patent No.: US 7,648,405 B2
(45) Date of Patent: Jan. 19, 2010

(54) METHOD OF MANUFACTURING AN ORGANIC ELECTROLUMINESCENT DEVICE WITH AN ENCAPSULATING SUBSTRATE

(75) Inventors: Dong-Soo Choi, Suwon-si (KR); Seung-Yong Song, Suwon-si (KR); Jin-Woo Park, Suwon-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 662 days.

(21) Appl. No.: 11/109,684

(22) Filed: Apr. 20, 2005

(65) Prior Publication Data

US 2005/0277355 A1 Dec. 15, 2005

(30) Foreign Application Priority Data

Jun. 9, 2004 (KR) .................. 10-2004-0042224

(51) Int. Cl.
*H01J 9/24* (2006.01)
(52) U.S. Cl. ............................................. 445/24
(58) Field of Classification Search ............ 445/25; 313/512; 427/66
See application file for complete search history.

(56) References Cited

U.S. PATENT DOCUMENTS

| | | | | | |
|---|---|---|---|---|---|
| 4,392,047 | A | * | 7/1983 | Bykhovsky et al. | 219/145.21 |
| 5,882,761 | A | * | 3/1999 | Kawami et al. | 428/69 |
| 6,136,386 | A | * | 10/2000 | Nakahigashi et al. | 427/536 |
| 2002/0050786 | A1 | * | 5/2002 | Yamazaki et al. | 313/504 |

FOREIGN PATENT DOCUMENTS

| | | |
|---|---|---|
| JP | 09-148066 | 6/1997 |
| JP | 11-176571 | 7/1999 |
| JP | 2001-115154 | 4/2001 |
| JP | 2002-203685 | 7/2002 |
| JP | 2002-216951 | 8/2002 |
| JP | 2003-142256 | 5/2003 |
| JP | 2004-079208 | 3/2004 |
| WO | WO 2004003961 A1 * | 1/2004 |

OTHER PUBLICATIONS

"Office Action" issued by Japanese Patent Office in Applicant's corresponding Japanese Patent Application No. 2005-163327 on Feb. 3, 2009.

* cited by examiner

*Primary Examiner*—Toan Ton
*Assistant Examiner*—Hana A Sanei
(74) *Attorney, Agent, or Firm*—Robert E. Bushnell, Esq.

(57) ABSTRACT

A method of manufacturing an organic electroluminescence device whereby an encapsulating layer is formed by coating an encapsulating substrate with an encapsulating layer-forming composition and thermally processing the encapsulating substrate. A plasma treatment is performed on the encapsulating substrate having the encapsulating layer. A sealant is applied to at least one of the plasma treated encapsulating substrate and a substrate on which an organic electroluminescent unit including a first electrode, an organic layer, and a second electrode, which are sequentially stacked, is deposited. The sealing substrate and the substrate on which the organic electroluminescent unit is deposited are combined. Contaminants generated around the encapsulating layer and generated in the thermal process can be effectively removed by the cleaning process using plasma. Therefore, the interfacial adhesion between the sealant and the substrate is greatly improved, thereby preventing permeation of external air, moisture, etc., into the device.

20 Claims, 1 Drawing Sheet ent No. 10-2004-0042224, filed on Jun. 9, 2004, in the
METHOD OF MANUFACTURING AN ORGANIC ELECTROLUMINESCENT DEVICE WITH AN ENCAPSULATING SUBSTRATE

CLAIM OF PRIORITY

This application claims the benefit of Korean Patent Application No. 10-2004-0042224, filed on Jun. 9, 2004, in the Korean Intellectual Property Office, the disclosure of which is incorporated herein in its entirety by reference.

BACKGROUND OF THE INVENTION

1. Field of the Invention

The present invention relates to an organic electroluminescence device, and more particularly, to an organic electroluminescence device with improved interfacial adhesion between a substrate and a sealant.

2. Description of the Related Art

Organic electroluminescence devices are deteriorated by moisture. Thus, a passivation structure for preventing moisture permeation is required.

In a conventional sealing structure, a metal can or a glass plate is processed into a cap having grooves, and a moisture-absorbing desiccant in powder form is loaded into the grooves. Alternatively, a film type desiccant is attached using a double-sided tape.

However, the method of loading the desiccant in powder form into the grooves is complicated and raises costs. In addition, the overall thickness of a substrate becomes thick, and the substrate used for passivation is not transparent so that it cannot be used for front emission. A metal can used for passivation is structurally rigid, whereas an etched glass is structurally fragile and is easily damaged by external impacts. When passivation is achieved using the film type desiccant, the permeation of moisture cannot be completely prevented, and the structure is likely to be broken by external impacts in a manufacturing process or in use. Therefore, passivation using the desiccant film is not suitable for mass production due to poor durability and low reliability.

Japanese Patent Laid-open Publication No. hei 9-148066 discloses an organic electroluminescence display device including a stacked structure with an organic emissive material layer interposed between a pair of opposing electrodes, a container sealing the stacked structure, and a desiccant such as an alkali metal compound placed inside the container. However, the organic electroluminescence display device is considerably thick due to the structure of the sealing container. In addition, even though the desiccant remains in a solid state after absorbing moisture, it is opaque and unsuitable for a front emission organic electroluminescence device. In addition, as described above, expensive materials and the complicated manufacturing processes increase the overall costs.

With development of a transparent, moisture-absorbing encapsulating layer for front emission organic electroluminescence devices, processing techniques relevant to the transparent encapsulating layer are being considered to be important. Among currently available transparent, moisture-absorbing encapsulating layer manufacturing techniques, a method of filling a glass cap with a liquid transparent moisture-absorbing material and calcinating it to form a coated layer is commonly used.

However, according to the conventional method, circumferential contamination occurs when coating the transparent moisture-absorbing material, and outgassing from solvents occurs during the calcinating process. As a result, the interfacial adhesion between the sealant and the glass substrate greatly decreases, thereby fatally affecting the lifetime characteristics of the device.

SUMMARY OF THE INVENTION

It is an object of the present invention to provide an improved method of manufacturing an organic electroluminescence device.

It is further an object of the present invention to provide an organic electroluminescence device with improved interfacial adhesion between a substrate and a sealant and improved lifetime characteristics, and a method of manufacturing the same.

According to an aspect of the present invention, there is provided a method of manufacturing an organic electroluminescence device, the method comprising: forming an encapsulating layer by coating an encapsulating substrate with an encapsulating layer-forming composition and thermally processing the encapsulating substrate; performing a plasma treatment on the encapsulating substrate having the encapsulating layer; applying a sealant to at least one of the plasma treated encapsulating substrate and a substrate on which an organic electroluminescent unit including a first electrode, an organic layer, and a second electrode, which are sequentially stacked, is deposited; and combining the sealing substrate and the substrate on which the organic electroluminescent unit is deposited.

The present invention also provides an organic electroluminescence device manufactured using the above-described method.

BRIEF DESCRIPTION OF THE DRAWING

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1:
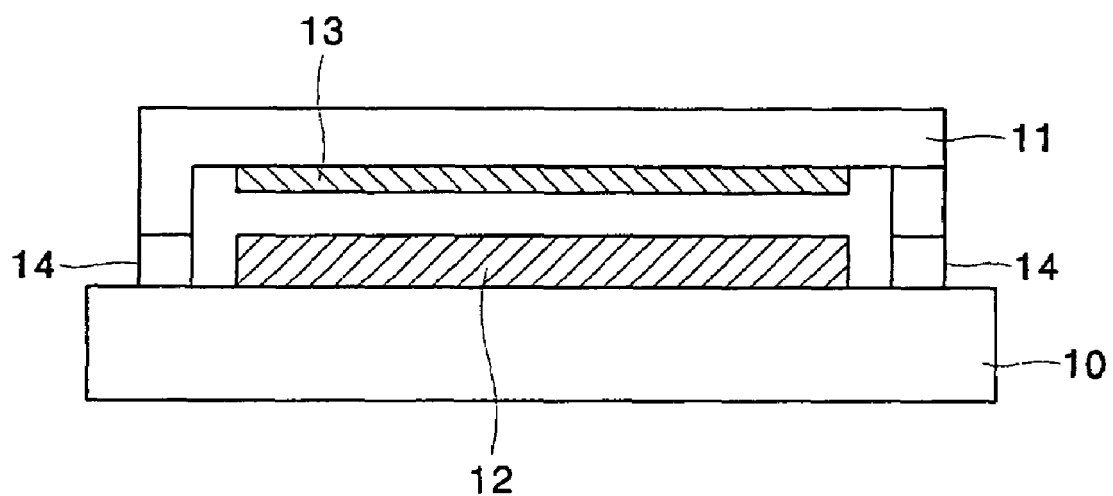
FIG. 1 is a sectional view of an organic electroluminescence device according to an embodiment of the present invention.

According to the present invention, after forming an encapsulating layer on an encapsulating substrate, the encapsulating substrate with the encapsulating layer, particularly, a region in which a sealant is later applied, is cleaned by plasma processing, thereby effectively removing contaminants generated in the forming of the encapsulating layer and contaminants generated (particularly, in the region in which the sealant is applied) due to outgassing during a process of heating the encapsulating layer and thus improving interfacial adhesion between the substrate and the sealant.

The plasma cleaning process may be performed under an inert gas atmosphere. If the plasma cleaning process is performed under an oxygen atmosphere, oxygen, etc., may adsorb into the encapsulating layer so that a moisture absorbing ability of the encapsulating layer may be lowered.

Examples of the inert gas include Ar, $N_2$, and the like. The plasma treatment may be performed at a pressure of $10^{-4}$-$10^{-5}$ torr, preferably, about $5 \times 10^{-5}$ torr, at an inert gas flow rate of 100-300 sccm, and at an RF power of 100-500 W for 1-20 minutes, preferably 1-10 minutes. Under these conditions, a great plasma cleaning effect results.

A method of manufacturing an organic electroluminescence device according to an embodiment of the present invention will be described.

First, a substrate with an organic electroluminescent unit including first electrode, an organic layer, and a second electrode, which are sequentially stacked on the substrate, is prepared. Next, a transparent, nano-porous oxide layer-forming composition in a sol state is prepared by mixing nano-sized porous oxide particles with a solvent and optionally an acid.

The encapsulating layer-forming composition is coated on an inner surface of the encapsulating substrate (i.e., a front substrate), dried, and then thermally treated to form a transparent nano-porous oxide layer acting as an encapsulating layer.

The thermal treatment may be performed at a temperature of 100-300° C., preferably, 200-250° C., to vaporize the solvent and form the transparent nano-porous oxide layer having particle-to-particle contact points.

Examples of the method of coating the composition include, but are not limited to, spin coating, spray coating, deep coating, dispensing, printing, etc.

Regarding the encapsulating layer, which is a transparent nano-porous oxide layer, solid particles of the encapsulating layer should not form hard agglomerate, and the size of the solid particles stably dispersed in a sol should be in a range in which no Reyleigh scattering occurs such that the encapsulating layer is transparent and not hazy. "Reyleigh scattering" refers to a phenomenon in which a coating layer seems bluish in a black background due to scattering in a short wavelength range. In order to obtain a coating layer having the characteristics, an average particle diameter of the porous oxide particles composing the sol may be 100 nm or less, preferably, 70 nm or less, more preferably, 20-60 nm or less. An average diameter of the pores in the nano-porous layer may be 100 nm or less, preferably 70 nm or less, more preferably, 20-60 nm.

A material for the transparent nano-porous oxide layer may be at least one compound selected from an alkali metal oxide, an alkali earth metal oxide, metal halide, a metal sulfate, and a metal perchlorate, which have an average particle diameter of 100 nm or less, preferably, 20-100 nm.

Examples of the alkali metal oxide include $Li_2O$, $Na_2O$, and $K_2O$. Examples of the alkali earth metal oxide include BaO, CaO, and MgO. Examples of the metal sulfate include $Li_2SO_4$, $Na_2SO_4$, $CaSO_4$, $MgSO_4$, $CoSO_4$, $Ga_2(SO_4)_3$, $Ti(SO_4)_2$, and $NiSO_4$. Examples of the metal halide include $CaCl_2$, $MgCl_2$, $SrCl_2$, $YCl_2$, $CuCl_2$, $CsF$, $TaF_5$, $NbF_5$, $LiBr$, $CaBr_3$, $CeBr_4$, $SeBr_2$, $VBr_2$, $MgBr_2$, $BaI_2$, and $MgI_2$. Examples of the metal perchlorate include $Ba(ClO_4)_2$ and $Mg(ClO_4)_2$.

The acid can be optionally used to improve a dispersion ability. Examples of the acid include HNO, HCl, $H_2SO_4$, $CH_3COOH$, etc. The amount of the acid may be in a range of 0.01-0.1 parts by weight based on 100 parts by weight of the nano-porous oxide particles.

Any solvent that can disperse the nano-porous oxide particles can be used. In particular, the solvent may be at least one solvent selected from ethanol, methanol, propanol, butanol, isopropanol, methylethylketone, pure water, propylene glycol (mono)methylether (PGM), isopropylcellulose (IPC), methylene chloride (MC), and ethylene carbonate (EC). The amount of the solvent may be in a range of 60-99 parts by weight based on 100 parts by weight of the porous oxide particles.

The transparent nano-porous oxide layer manufactured using the above-described method according to the present invention has a thickness of 0.1-12 μm, and has great moisture absorption and oxygen adsorption characteristics, and thus has a great ability of sealing an organic electroluminescence device.

As described above, a cleaning process using plasma is performed on a region of the encapsulating substrate in which a sealant is later applied under the above-described plasma processing conditions after the encapsulating layer has been formed.

Next, a sealant is applied to at least one of the substrate with the organic electroluminescent unit and the encapsulating substrate. Then, the two substrates (i.e., the substrate with the organic electroluminescent unit and the encapsulating substrate) are combined together at a reduced pressure of, for example, 600-650 torr to evacuate the internal space.

Next, after performing a first sealant-curing process on the resulting structure by radiating UV light, a second sealant-curing process (reinforcing hardening) is preformed by thermal treatment. The temperature of the thermal treatment may be '100° C. or less, preferably, 60-80° C.

Examples of the sealant include, but are not limited to, a thermally curable resin, a UV-curable resin, an epoxy resin, etc.

The organic electroluminescence device manufactured according to the above-describe processes is shown in FIG. 1.

Referring to FIG. 1, the organic electroluminescence device includes a rear substrate 10 composed of glass or a transparent insulating material, an organic electroluminescent unit 12 formed on one surface of the rear substrate 10 and including a first electrode, an organic layer, and a second electrode sequentially stacked upon one another, and an encapsulating substrate 11 sealing an internal space including the organic electroluminescent unit 12 by being coupled to the rear substrate 10. The encapsulating substrate 11 has an encapsulating layer 13 containing nano-sized oxide particles and nano-sized pores. The encapsulating substrate 11 and the rear substrate 10 are combined together by a sealant applied around the organic electroluminescent unit 12.

The present invention will be described in further detail with reference to the following examples. The following examples are for illustrative purposes and are not intended to limit the scope of the invention.

EXAMPLE 1

A nitric acid was added to 95 g of ethanol to adjust pH to 2.5 g of CaO powder was added to the solution and mixed for 3 hours or longer to obtain a mixture in sol state.

The mixture in sol state was spin-coated on a soda glass substrate at 180 rpm for 120 seconds and dried in a drying oven for about 2 minutes to remove the unvaporized solvent. The resulting structure was thermally treated at about 250° C. for 30 minutes to form a transparent, nano-porous CaO layer having a thickness of 3.5 μm.

A plasma treatment was performed on a region of the soda glass substrate, in which a sealant was later applied, in an Ar gas atmosphere after the transparent, nano-porous CaO layer was formed. The plasma treatment was performed at a pressure of about $5 \times 10^{-5}$ torr, an Ar flow rate of about 150-250 sccm, and a RF power of about 300 W for about 5 minutes.

Subsequently, an epoxy resin as a sealant was applied to at least one of the plasma-treated soda glass substrate and a glass substrate on which a first electrode, an organic layer and a second electrode had been deposited, and the two substrates were combined under a pressure of 3 kg while evacuating the internal space to about 600 torr. Next, a first curing process was performed by radiating UV light for 300 seconds.

A second curing process was performed by thermally processing the structure at about 80° C. for 1 hour, thereby resulting a complete organic electroluminescence device.

COMPARATIVE EXAMPLE 1

An organic electroluminescence device was manufactured in the same manner as in Example 1, except that, after the transparent, nano-porous CaO layer was formed, the region of the soda glass substrate in which the sealant was later applied was coated with a protective sheet instead of being subjected to the plasma treatment.

COMPARATIVE EXAMPLE 2

An organic electroluminescence device was manufactured in the same manner as in Example 1, except that, after the transparent, nano-porous CaO layer was formed, the region of the soda glass substrate in which the sealant was later applied was cleaned using acetone instead of being subjected to the plasma treatment.

COMPARATIVE EXAMPLE 3

An organic electroluminescence device was manufactured in the same manner as in Example 1, except that, after the transparent, nano-porous CaO layer was formed, the region of the soda glass substrate in which the sealant was later applied after the transparent, nano-porous CaO layer was formed was cleaned using UV and $O_3$ instead of being subjected to the plasma treatment.

COMPARATIVE EXAMPLE 4

A nitric acid was added to 95 g of ethanol to adjust pH to 2. 5 g of CaO powder was added to the solution and mixed for 3 hours or longer to obtain a mixture in sol state.

Separately, a soda glass substrate was cleaned using UV and $O_3$ for 15 minutes. The mixture in sol state was spin-coated on the soda glass substrate at 180 rpm for 120 seconds and dried in a drying oven for about 2 minutes to remove the unvaporized solvent.

The resulting structure was thermally treated at about 250° C. for 30 minutes to form a transparent, nano-porous CaO layer having a thickness of thickness of 3.5 μm.

Subsequently, an epoxy resin as a sealant was applied to at least one of the plasma-treated soda glass substrate and a glass substrate on which a first electrode, an organic layer, and a second electrode had been deposited, and the two substrates were combined under a pressure of 3 kg while evacuating the internal space to about 600 torr. Next, a first curing process was performed by radiating UV light for 300 seconds. A second curing process was performed by thermally processing the structure at about 80° C. for one hour, thereby resulting a complete organic electroluminescence device.

Using each of the organic electroluminescence devices manufactured according to Example 1 and Comparative Examples 1 through 4, the adhesion between the two substrates was measured. The results are shown in TABLE 1. The adhesion between the two substrate was measured as follows.

After separating the two substrates from one another, the amounts of the sealant remaining on the substrates were measured. A score of 5 was given when equal amounts of sealant remained on each of the substrates, and a score of 1 was given when the sealant remained on only one of the substrates.

TABLE 1

|  | Adhesion measurement Result |
| --- | --- |
| Example 1 | 4 |
| Comparative Example 1 | 1 |
| Comparative Example 2 | 1 |
| Comparative Example 3 | 3 |
| Comparative Example 4 | 1 |

Referring to Table 1, the adhesion between the sealant and the soda glass substrate in the organic electroluminescence device according to Example 1 is improved compared to the organic electroluminescence devices according to Comparative Examples 1 through 4.

Meanwhile, in the organic electroluminescence device according to Comparative Example 3, in which $UV-O_3$ cleaning was performed on the region of the soda glass substrate in which the sealant was later applied in an atmospheric condition after the transparent, nano-porous CaO layer was formed as the encapsulating layer, the moisture-absorbing and oxygen-adsorbing capacities of the encapsulating layer fatally deteriorate due to the adsorption of atmospheric oxygen into the encapsulating layer so that the organic electroluminescence device cannot be used. In addition, in the organic electroluminescence device according to Comparative Example 4, in which $UV-O_3$ cleaning was performed on the soda glass substrate before forming the encapsulating layer, contaminants generated when forming the encapsulating layer cannot be removed so that the effect of improving the interfacial adhesion between the sealant and the substrate is trivial.

According to the present invention, contaminants generated around an encapsulating layer when coating the encapsulating layer containing a transparent moisture absorbing material and organic/inorganic composite contaminants generated in a calcinating process after the coating of the encapsulating layer can be effectively removed by a cleaning process using plasma. Therefore, the interfacial adhesion between the sealant and the substrate is greatly improved, thereby preventing permeation of external air, moisture, etc., into the device. Therefore, according to the present invention, organic electroluminescence devices with improved characteristics, such as lifetime, can be manufactured.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an organic electroluminescence device, the method comprising:
    forming an encapsulating layer on an encapsulating substrate by coating the encapsulating substrate with an encapsulating layer-forming composition and thermally processing the coated encapsulating substrate;
    removing contaminants attached to a region of the encapsulating substrate by performing a plasma treatment on the region of the encapsulating substrate, with the plasma treated region of the encapsulating substrate being reserved to receive a sealant;
    applying the sealant to at least one of the plasma treated region of the plasma treated encapsulating substrate and a substrate on which an organic electroluminescent unit is deposited, the organic electroluminescent unit including a first electrode, an organic layer, and a second electrode, which are sequentially stacked; and combining the encapsulating substrate and the substrate on which the organic electroluminescent unit is deposited.

2. The method of claim 1, wherein the plasma treatment is performed in an inert gas atmosphere.

3. The method of claim 1, wherein the encapsulating layer is a transparent, nano-porous oxide layer.

4. The method of claim 1, wherein the encapsulating layer-forming composition is a transparent, nano-porous oxide layer-forming composition in sol state obtained by mixing nano-sized porous oxide particles with a solvent and optionally an acid.

5. The method of claim 4, wherein the solvent is at least one selected from the group consisting of ethanol, methanol, propanol, butanol, isopropanol, methylethylketone, pure water, propylene glycol (mono)methylether (PGM), isopropylcellulose (IPC), methylene chloride (MC), and ethylene carbonate (EC).

6. The method of claim 4, wherein the acid is at least one selected from the group consisting of a nitric acid, a hydrochloric acid, a sulfuric acid, and an acetic acid.

7. The method of claim 4, wherein the transparent, nano-porous oxide layer-forming composition in sol state contains the solvent in an amount of 60 to 99 parts by weight based on 100 parts by weight of the nano-sized porous oxide particles, and the acid in an amount of 0.01 to 0.1 parts by weight based on 100 parts by weight of the nano-porous oxide particles.

8. The method of claim 4, wherein the nano-porous oxide particles are derived from at least one selected from the group consisting of an alkali metal oxide, an alkali earth metal oxide, a metal halide, a metal sulfate, and a metal perchlorate, which have an average particle diameter of 100 nm or less.

9. The method of claim 8, wherein the alkali metal oxide is selected from the group consisting of $Li_2O$, $Na_2O$, and $K_2O$, the alkali earth metal oxide is selected from the group consisting of BaO, CaO, and MgO, the metal sulfate is selected from the group consisting of $Li_2SO_4$, $Na_2SO_4$, $CaSO_4$, $MgSO_4$, $CoSO_4$, $Ga_2(SO_4)_3$, $Ti(SO_4)_2$, and $NiSO_4$, the metal halide is selected from the group consisting of $CaCl_2$, $MgCl_2$, $SrCl_2$, $YCl_2$, $CuCl_2$, $CsF$, $TaF_5$, $NbF_5$, $LiBr$, $CaBr_3$, $CeBr_4$, $SeBr_2$, $VBr_2$, $MgBr_2$, $BaI_2$, and $MgI_2$, and the metal perchlorate is selected from the group consisting of $Ba(ClO_4)_2$ and $Mg(ClO_4)_2$.

10. The method of claim 1, wherein the encapsulating layer is a transparent, nano-porous CaO layer.

11. The method of claim 1, wherein the step of thermally processing the coated encapsulating substrate is performed at a temperature of 100 to 300° C.

12. The method of claim 1, wherein the sealant is a thermally curable resin or a UV-curable resin.

13. The method of claim 1, wherein the step of combining the encapsulating substrate and the substrate comprises an evacuating process, a UV radiating process, and a thermal curing process.

14. An organic electroluminescence device manufactured using the method of any one of claim 1.

15. A method of manufacturing an organic electroluminescence device, the method comprising:
    forming a moisture-absorbing layer on an encapsulating substrate;
    removing contaminants attached to a region of the encapsulating substrate by Performing a plasma treatment on the region of the encapsulating substrate after forming the moisture-absorbing layer, with the plasma treated region of the encapsulating substrate being reserved to receive a sealant; and
    sealing an organic electroluminescent unit deposited on a substrate by applying the sealant to at least one of the plasma treated region of the encapsulating substrate and the substrate on which the organic electroluminescent unit is deposited, the organic electroluminescent unit comprising a first electrode, an organic layer, and a second electrode.

16. The method of claim 15, wherein the plasma treatment is performed in an inert gas atmosphere.

17. The method of claim 16, wherein the step of performing the plasma treatment is performed at a pressure of $10^{-4}$ to $10^{-5}$ torr, at an inert gas flow rate of 100 to 300 sccm, and at an RF power of 100 to 500 W for 1 to 20 minutes.

18. The method of claim 15, wherein the moisture-absorbing layer is a transparent nano-porous oxide layer.

19. The method of claim 15, wherein the step of forming the moisture-absorbing layer comprises preparing a mixture in sol state obtained by mixing nano-sized porous oxide particles with a solvent and an acid, coating the mixture on the encapsulating substrate, and thermally treating the coated encapsulating substrate.

20. The method of claim 19, wherein an average particle diameter of the nano-sized porous oxide particles is 100 nm or less.

* * * * *